United States Patent
Liang et al.

(10) Patent No.: US 10,098,220 B2
(45) Date of Patent: Oct. 9, 2018

(54) ELECTRONIC DEVICE HEAT TRANSFER SYSTEM AND RELATED METHODS

(71) Applicant: Intel Corporation, Santa Clara, CA (US)

(72) Inventors: Zuyang Liang, Portland, OR (US); George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,989

(22) Filed: Dec. 24, 2015

(65) Prior Publication Data

US 2017/0188448 A1 Jun. 29, 2017

(51) Int. Cl.
*H05K 1/02* (2006.01)
*H05K 7/20* (2006.01)

(52) U.S. Cl.
CPC ......... *H05K 1/0203* (2013.01); *H05K 7/2039* (2013.01); *H05K 2201/06* (2013.01)

(58) Field of Classification Search
CPC ............. H05K 7/20236; H05K 7/2069; H05K 7/20463; H05K 7/20445; H05K 1/0203–1/021
USPC ................ 361/699, 702, 708–711, 718–719; 257/713–714; 174/521, 526, 547, 548
See application file for complete search history.

(56) References Cited

U.S. PATENT DOCUMENTS

| | | | | |
|---|---|---|---|---|
| 4,915,167 A * | 4/1990 | Altoz | ...... | F28F 13/00 165/185 |
| 5,907,474 A * | 5/1999 | Dolbear | ...... | H01L 23/04 174/524 |
| 5,909,056 A * | 6/1999 | Mertol | ...... | H01L 23/24 257/704 |
| 6,016,006 A * | 1/2000 | Kolman | ...... | H01L 21/54 257/712 |
| 6,281,573 B1 * | 8/2001 | Atwood | ...... | H01L 23/3675 165/80.3 |
| 6,292,362 B1 * | 9/2001 | O'Neal | ...... | H01L 23/42 165/122 |

(Continued)

OTHER PUBLICATIONS

International search report for PCT application No. PCT/US16/63753 filed Nov. 25, 2016; date of mailing May 10, 2017; 19 pages.

*Primary Examiner* — Dion R Ferguson
*Assistant Examiner* — Amir Jalali
(74) *Attorney, Agent, or Firm* — Thorpe North & Wester, LLP; David W. Osborne

(57) ABSTRACT

Electronic device heat transfer technology is disclosed. In an example, an electronic device package can include a substrate. The electronic device package can also include a heat transfer component. The electronic device package can further include a heat-generating electronic component coupled to the substrate between the substrate and the heat transfer component. The electronic device package can also include a viscous thermal interface material (TIM) providing a heat transfer pathway between the electronic component and the heat transfer component. In addition, the electronic device package can include a barrier about at least a portion of a periphery of the viscous TIM to maintain the viscous TIM within a confined location in proximity to the electronic component. The TIM is uninterrupted by the barrier within the periphery.

21 Claims, 4 Drawing Sheets

(56) References Cited

U.S. PATENT DOCUMENTS

| | | | | |
|---|---|---|---|---|
| 6,665,186 B1* | 12/2003 | Calmidi | H01L 23/16 | 165/80.4 |
| 7,654,311 B2* | 2/2010 | Yang | H01L 23/34 | 165/185 |
| 7,833,839 B1* | 11/2010 | Touzelbaev | H01L 23/42 | 257/706 |
| 8,030,757 B2* | 10/2011 | Renavikar | H01L 21/50 | 257/704 |
| 8,796,842 B2* | 8/2014 | Refai-Ahmed | H01L 23/04 | 257/713 |
| 2003/0085475 A1* | 5/2003 | Im | H01L 23/16 | 257/796 |
| 2004/0118501 A1* | 6/2004 | Chiu | H01L 21/4871 | 156/64 |
| 2004/0262766 A1* | 12/2004 | Houle | H01L 23/04 | 257/758 |
| 2005/0073816 A1* | 4/2005 | Hill | H01L 23/4275 | 361/708 |
| 2006/0118925 A1* | 6/2006 | Macris | H01L 23/26 | 257/667 |
| 2007/0127211 A1* | 6/2007 | Macris | H01L 23/42 | 361/700 |
| 2008/0137300 A1* | 6/2008 | Macris | H01L 23/10 | 361/699 |
| 2009/0152713 A1* | 6/2009 | Sauciuc | H01L 23/3737 | 257/713 |
| 2010/0181665 A1* | 7/2010 | Casey | H01L 23/04 | 257/723 |
| 2011/0308782 A1* | 12/2011 | Merrill | C09K 5/08 | 165/185 |
| 2012/0098119 A1* | 4/2012 | Refai-Ahmed | H01L 21/54 | 257/714 |
| 2013/0016477 A1* | 1/2013 | Yokoya | H01L 23/36 | 361/719 |
| 2014/0217575 A1* | 8/2014 | Hung | H01L 21/50 | 257/713 |
| 2015/0318266 A1* | 11/2015 | Jang | H01L 23/3736 | 257/720 |
| 2016/0133602 A1* | 5/2016 | Chen | H01L 23/49827 | 257/712 |
| 2016/0197025 A1* | 7/2016 | Bhagwagar | C09J 183/04 | 257/717 |
| 2016/0225742 A1* | 8/2016 | Davis | H01L 25/0655 | |
| 2016/0351467 A1* | 12/2016 | Li | H01L 23/3672 | |
| 2016/0358836 A1* | 12/2016 | Colgan | H01L 23/3675 | |

* cited by examiner

ELECTRONIC DEVICE HEAT TRANSFER SYSTEM AND RELATED METHODS

TECHNICAL FIELD

Embodiments described herein relate generally to cooling of electronic devices.

BACKGROUND

Heat generated by an electronic component, such as a computer processor, can negatively impact the component's electrical performance and lifespan. The heat can also negatively impact adjacent electronic components and surrounding hardware. As a result, heat-generating electronic components are often cooled by thermally coupling the component with a heat exchanger, such as a heat spreader, heat sink, etc. Thermal coupling can be achieved by interfacing a flat surface of the electronic component with a flat surface of the heat exchanger. The goal in interfacing the surfaces is to eliminate any air between them as air impedes heat movement. Unfortunately, the interfacing surfaces almost always have imperfections which prevent 100% surface contact between them. Therefore, a thermal interface material (TIM), such as a thermal grease, can be included to fill and eliminate air gaps between the heat transfer surfaces, and improve thermal performance, which in turn benefits the electronic component's electrical performance and life span.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
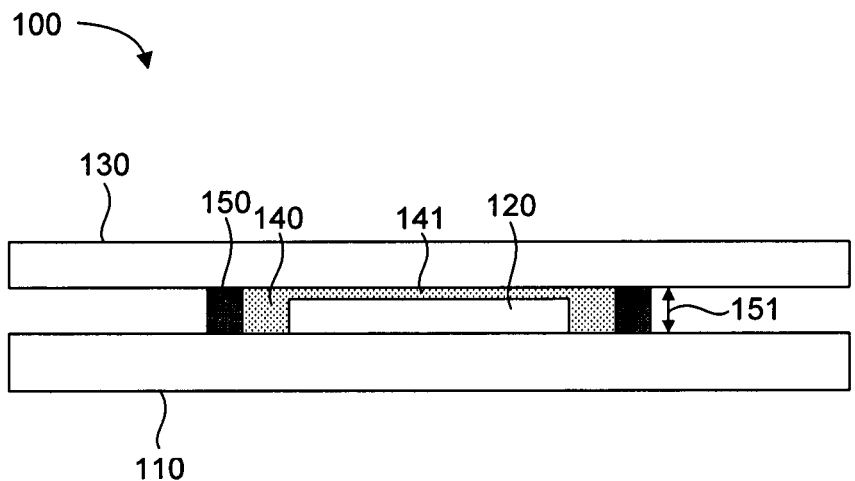
FIG. 1 illustrates a schematic cross-sectional view of an exemplary electronic device heat transfer system.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also included are equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "an electronic component" includes a plurality of such electronic components.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term, like "comprising" or "including," in this specification it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

As interfacing heat transfer surfaces heat and cool with thermal cycles, such as power on/off cycles, the heat transfer surfaces expand and contract. This thermal deformation of the heat transfer surfaces can cause the TIM (e.g. thermal grease) to "pump out" from between the heat transfer surfaces and therefore reduce heat transfer efficiency as well as electrical performance. As a result, TIM materials have been developed to reduce pump out by altering flow characteristics. The trade-off with such materials is a reduction in heat transfer capability and/or increased cost.

Invention embodiments provide an electronic device package configured to contain, for example by physically trapping, TIM between heat transfer surfaces. In one aspect, the TIM is physically trapped without providing structural interference in the bond line or interface area between heat transfer surfaces. As a result, heat transfer capacity is not limited due to limitations on the proximity of the heat transfer surfaces, which in turn facilitates use in high power and high heat generation applications. The electronic device package can include: a substrate; a heat transfer component; a heat-generating electronic component coupled to the substrate between the substrate and the heat transfer component; a viscous TIM providing a heat transfer pathway between the electronic component and the heat transfer component; and a barrier about at least a portion of a periphery of the viscous TIM to maintain the viscous TIM within a confined location in proximity to the electronic component. Generally speaking, the TIM is uninterrupted by the barrier within the periphery.

Referring to FIG. 1, an exemplary electronic device heat transfer or cooling system 100 is illustrated schematically in cross-section. The principles disclosed herein can be applied to various heat transfer applications, such as heat transfer from an individual processor or die (which can include multiple processors), an electronic device package (which can include multiple dies), or multiple components on a primary circuit board, for example. The heat transfer system 100 can include a substrate 110. The substrate 110 can be of any suitable type or configuration, such as a substrate of an electronic device package, a motherboard, etc. The heat transfer system 100 can also include one or more heat-generating electronic components 120 (e.g., a processor), which can be coupled to the substrate 110. The heat transfer system 100 can further include a heat transfer component 130 to remove heat from the heat-generating electronic component 120. As shown in the figure, the heat-generating electronic component 120 can be located between the substrate 110 and the heat transfer component 130. The heat transfer component 130 can be of any suitable type or configuration, such as a heat spreader, a heat sink, or any other type of heat transfer component of a thermal solution for an electronic device. Ideally, the electronic component 120 and the heat transfer component 130 would be in thermal contact with interfacing surfaces that are perfectly flat, smooth surfaces. In reality, however, such interfacing surfaces have imperfections that reduce the effectiveness of a thermal interface by creating air gaps between the electronic component 120 and the heat transfer component 130, which serves to thermally insulate the components from one another. Thus, a viscous TIM 140 can be included to fill and eliminate air gaps at a bond line 141 or interface area between the electronic component 120 and the heat transfer component 130 and provide a heat transfer pathway between the components to improve heat transfer performance. The heat transfer pathway can include the heat-generating electronic component 130. The heat-generating electronic component 130 can initiate movement of heat energy along the heat transfer pathway.

Thermal interface material is also known as thermal grease, CPU grease, heat paste, heat sink compound, heat sink paste, thermal compound, thermal gel, or thermal paste. A TIM can be a thermally conductive adhesive, which is commonly used as an interface between heat sinks and heat sources (e.g., high-power semiconductor devices). As such, a TIM can provide mechanical strength at the bond line 141 between the electronic component 120 and the heat transfer component 130. A TIM can have a polymerizable liquid matrix and large volume fractions of electrically insulating, but thermally conductive filler. Typical matrix materials are epoxies, silicones, urethanes, and acrylates. Typical fillers are aluminum oxide, boron nitride, zinc oxide, and aluminum nitride. The filler loading can be as high as 70-80 wt % although this is not meant to be limiting. In some cases, a TIM can include metal, such as copper or silver.

Due to thermal expansion and contraction of the electronic component 120 and the heat transfer component 130 occurring with each thermal cycle, the viscous TIM 140 can "pump out" (i.e. be pressed or squeezed out) from between the components, which can reduce heat transfer efficiency. Pump out of the viscous TIM 140 can also cause the solids and liquids of the viscous TIM to separate, which can also contribute to reduced heat transfer efficiency.

Figure 2:
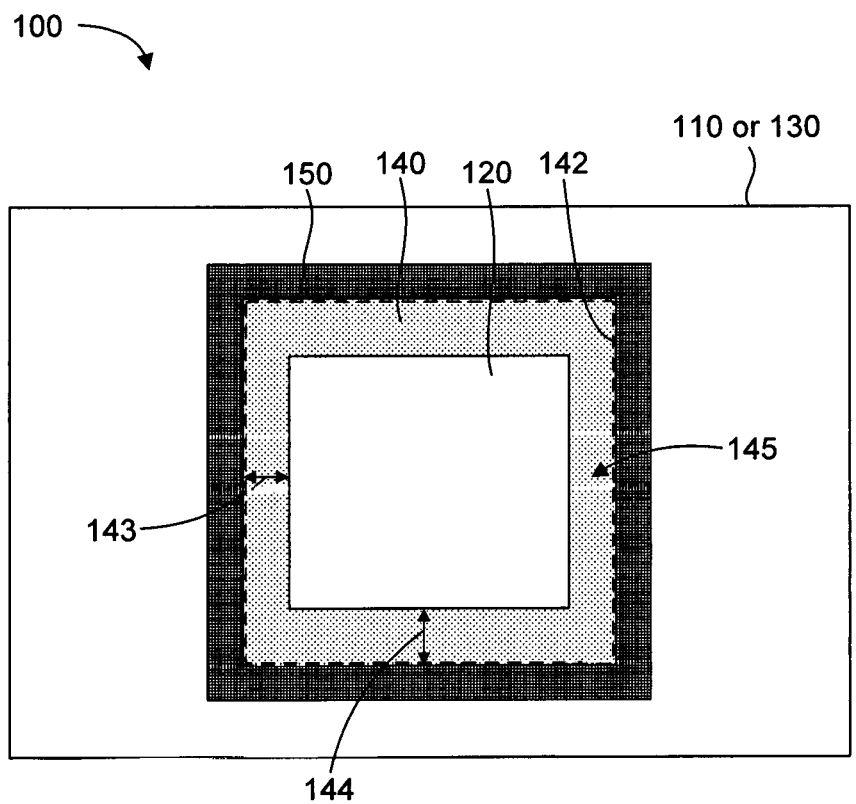
FIG. 2 illustrates a schematic top view of an exemplary electronic device heat transfer system with certain elements omitted to reveal aspects of the system.

FIG. 2 illustrates a top view of the heat transfer system 100 with either the substrate 110 or the heat transfer component 130 omitted to show certain additional aspects of the heat transfer system 100 discussed below. With reference to FIGS. 1 and 2, the heat transfer system 100 can further include a barrier 150 to prevent or minimize pump out of the viscous TIM 140 from between the electronic component 120 and the heat transfer component 130. The barrier 150 can be disposed about at least a portion of a periphery 142 of the viscous TIM 140 to maintain the viscous TIM within a confined location in proximity to the electronic component 120. The viscous TIM 140 can be uninterrupted by the barrier 150 within the periphery 142, as shown in FIG. 2. Because the barrier 150 does not interrupt the viscous TIM within the periphery 142, the barrier 150 provides no obstructions at the bond line 141 or interface area between the electronic component 120 and the heat transfer component 130. With no structural impediments or interference provided by the barrier 150 at the bond line 141 or interface area between the electronic component 120 and the heat transfer component 130, interfacing surfaces of these components can be freely located in close proximity to one another. This promotes heat transfer from one component to another, which can facilitate the use of the barrier 150 with high power and high heat generating components.

The barrier 150 can contact both the substrate 110 and the heat transfer component 130 and extend between the substrate and the heat transfer component. In one aspect, the barrier 150 can be continuous about the periphery 142 of the viscous TIM 140. Thus, the barrier 150 can dam or physically trap the viscous TIM 140 to prevent or minimize the flow or migration (e.g., pump out) of the viscous TIM 140 away from a predetermined location in a heat transfer pathway of the heat generating electronic component 120, such as from between the electronic component 120 and the heat transfer component 130. A predetermined location for a heat transfer pathway can be bounded by or between layers of components, such as between the substrate 110 and the heat transfer component 130. By maintaining the viscous TIM 140 in place between the heat generating electronic component 120 and the heat transfer component 130, heat transfer efficiency of a heat transfer pathway between these components can be maintained, which can maintain performance of the electronic component 120.

In general, a barrier as disclosed herein can be utilized to maintain a viscous TIM between layers of components, such as between a heat generating component and a heat transfer component or between two heat transfer components (e.g., a heat spreader and a heat sink). Furthermore, a metal-based TIM, which can be electrically conductive and capacitive, can cause malfunction and damage to circuits when pumped out from between components. The barrier 150 can prevent the flow of metal-based TIM onto a circuit and therefore avoid such problems.

In one aspect, the barrier 150 can be a gasket distinct from the viscous TIM 140. For example, a flexible, compressible material and gasket structure can be used as the barrier 150 such that the gasket can compress to form a seal. Such a gasket can be of any suitable construction or configuration. In one aspect, the gasket can be configured as an electromagnetic interference (EMI) shielding gasket. Nearly any material suitable for use as a gasket (i.e. for containing the TIM) can be utilized, such as rubbers and polymers. Examples of suitable gasket materials can include without limitation, compressible elastomers, including fluroelastomers, neoprene, nitrile, other polymeric materials, nitrile, ethylene propylene diene monomer (EPDM), silicone, fluorinated silicone, and butyl rubbers. A suitable gasket material may be selected based on the viscous TIM. For example, a gasket material may be selected that is compatible with the viscous TIM, e.g., a material that does not react with the viscous TIM or a material that is impermeable to a liquid component of the viscous TIM. The barrier 150 can have any suitable thickness 151, which may depend on the thickness of the electronic component 120 or any other component (e.g., a heat spreader) that is disposed between layers of components. For example, the thickness 151 can be from about 50 µm to about 500 µm when the electronic component 120 is a die or similarly sized component. The thickness between layers of components can be several millimeters when a heat spreader or similarly sized component is disposed between layers of components. The gasket can have any suitable cross-sectional shape (as viewed in FIG. 1), as well as any suitable overall shape or configuration (as viewed in FIG. 2). For example, the gasket can have a round, oval, square, rectangular, hexagonal, curved, indented, or other cross-sectional shape. For example, the gasket can have an overall shape, including a perimeter shape (e.g., rectangular) that resembles or conforms to a shape of the electronic component 120 (e.g., rectangular perimeter). Such configurations can efficiently utilize space about the electronic component 120, although the shape of the gasket and the shape of the electronic component 120 need not be similar. In one aspect, a gasket disposed about the viscous TIM 140 can form the barrier 150 with a lateral gap or space 143, 144 between the heat generating electronic component 120 and the barrier 150 to form a volume 145 about the electronic component 120. The volume 145 can contain excess viscous TIM 140 that may be pressed or squeezed from between the electrical component 120 and the heat transfer component 130 at assembly. Such gaps 143, 144 can be of any suitable size and can be similar or different in dimension. In one aspect, the gasket can have an open configuration or shape, such that there is an opening in a portion of the periphery of the gasket, which can be configured to provide for pressure relief, if desired, such as to accommodate expansion of the viscous TIM when heated. It should be recognized that the viscous TIM need not fill the entire volume 145.

In one aspect, an electronic device cooling system can be represented in FIG. 2, having either the substrate 110 or the heat transfer component 130, and the barrier 150 can be configured to engage the substrate 110 and/or the heat transfer component 130 at a location associated with a heat transfer pathway, such as about the electronic component 120. The barrier 150 can be provided with or without an adhesive. For example, the barrier 150 with an adhesive can be pre-attached to the substrate 110 or the heat transfer component 130 and provided for assembly with other components, such as the electronic component 120 and the other of the substrate and the heat transfer component. In another example, the barrier 150 with an adhesive can be pre-attached to the substrate 110 about the electronic component 120 and provided for assembly with other components, such as the heat transfer component. Pre-attaching the barrier 150 to a component can reduce assembly costs.

In one aspect, the barrier 150 can comprise a hardened portion of the viscous TIM 140. For example, a viscous TIM for facilitating heat transfer between two components can include a viscous thermal grease and a hardenable polymer or other curable material. The polymer or curable material can form a hardened structure when cured or exposed to a hardening agent. Thus, a hardened or cured portion of the TIM can form the barrier 150 about at least a portion of the periphery 142 of the viscous TIM 140. The hardenable polymer or curable material can be hardened or cured by any suitable mechanism, such as exposure to UV light and/or oxygen, although these examples are not meant to be limiting. Thus, a viscous TIM having a hardenable or curable material can be dispensed and applied before assembly of the heat generating electronic component 120 and the heat transfer component 130. Once the heat generating electronic component 120 and the heat transfer component 130 have been assembled, an outer or exposed portion of the TIM can be cured or hardened to form the barrier 150, which in this case is a non-flowing hardened portion of the TIM forming a dam about the periphery 142 of the viscous TIM 140. Within the barrier 150 formed by the hardened outer portion of the TIM, the viscous TIM 140 can remain uncured or unhardened and therefore fully functional as a TIM between the electronic component 120 and the heat transfer component 130.

Utilizing the barrier 150 as disclosed herein can facilitate use of any suitable viscous TIM that can provide an acceptable level of thermal performance. With no structural obstructions provided by the barrier 150 between the electronic component 120 and the heat transfer component 130, the presence of the barrier 150 does not negatively impact heat transfer between the components. The barrier 150 can therefore be effectively utilized in any suitable application, including high power, high heat applications.

Figure 3:
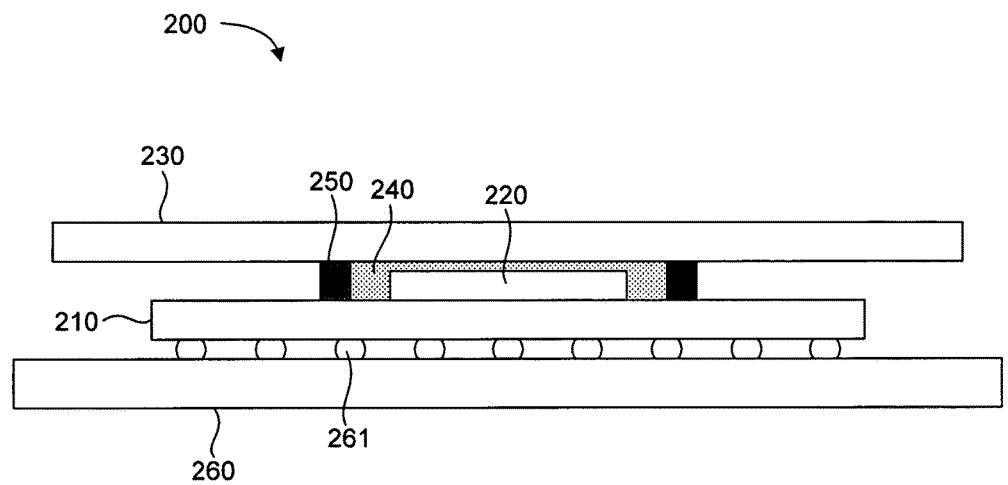
FIG. 3 illustrates a schematic cross-sectional view of another exemplary electronic device heat transfer system.

FIG. 3 illustrates an electronic device heat transfer or cooling system 200 in accordance with another example of the present disclosure. The system 200 is similar in many respects to the system 100 discussed above. For example, the system 200 includes a substrate 210, a heat generating electronic component 220, a heat transfer component 230, a viscous TIM 240, and a barrier 250. In this case, the substrate 210 (i.e. a first substrate) can be coupled to another substrate 260 (i.e. a second substrate), such as a primary circuit board or motherboard. The first substrate 210 can be coupled to the second substrate 260 in any suitable manner, such as with solder balls 261. The heat transfer component 230 can be configured for use with only the electronic component 220 or configured for more generalized use, such as providing a heat sink for multiple components (not shown) mounted on the second substrate 260. The heat transfer component 230 may or may not be coupled to the first substrate 210 and/or the second substrate 260.

Figure 4:
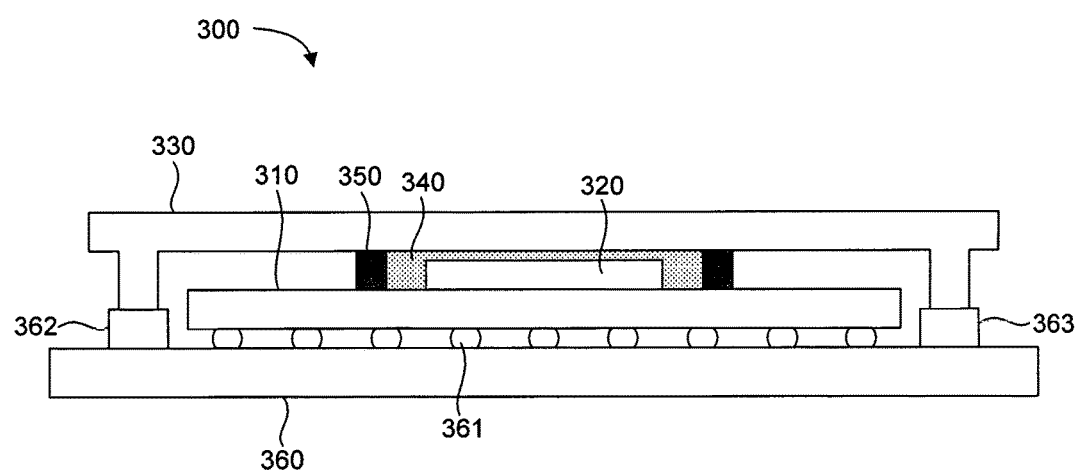
FIG. 4 illustrates a schematic cross-sectional view of a further exemplary electronic device heat transfer system.

FIG. 4 illustrates an electronic device heat transfer or cooling system 300 in accordance with another example of the present disclosure. The system 300 is similar to the system 200. The system 300 includes a substrate 310, a heat generating electronic component 320, a heat transfer component 330, a viscous TIM 340, and a barrier 350. The substrate 310 (i.e. a first substrate) is also coupled to another substrate 360 (i.e. a second substrate), such as a primary circuit board or motherboard, via solder balls 361. In this case, the heat transfer component 330 is coupled to the second substrate 360 via mounts 362, 363.

Figure 5:
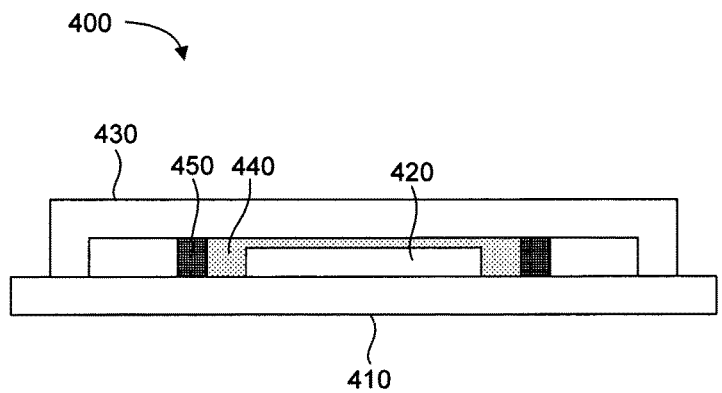
FIG. 5 illustrates a schematic cross-sectional view of an exemplary electronic device heat transfer system configured as an electronic device package.

FIG. 5 illustrates an electronic device heat transfer or cooling system 400 in accordance with another example of the present disclosure. As with other examples, the system 400 includes a substrate 410, a heat generating electronic component 420, a heat transfer component 430, a viscous TIM 440, and a barrier 450. In this case, the system 400 is configured as an electronic device package. Thus, the heat transfer component 430 can be configured as an integrated heat spreader or sink that is coupled to the substrate 410.

Figure 6:
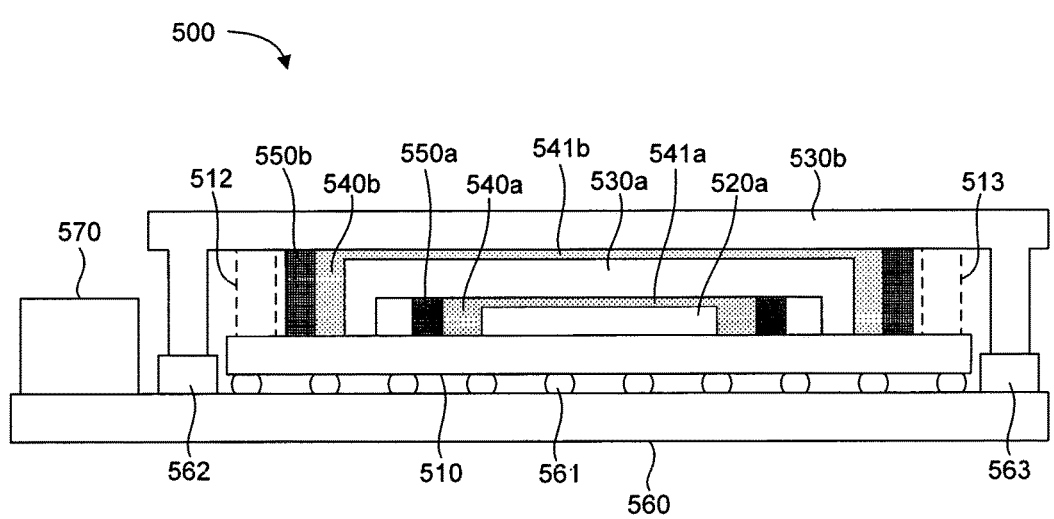
FIG. 6 illustrates a schematic cross-sectional view an additional exemplary electronic device heat transfer system.

FIG. 6 illustrates an electronic device heat transfer or cooling system 500 in accordance with another example of the present disclosure. The system 500 includes a substrate 510 (i.e. a first substrate), a heat generating electronic component 520a, a heat transfer component 530a, a viscous TIM 540a, and a barrier 550a. Collectively, these components can be configured as an electronic device package that is mounted on a substrate 560 (i.e. a second substrate), such as a primary circuit board or motherboard, via solder balls 561. In this example, the system 500 can include another heat transfer component 530b (e.g., a heat spreader or a heat sink) to remove heat from the heat transfer component 530a (e.g., a heat spreader). As with the viscous TIM 540a in a bond line 541a between the electronic component 520a and the heat transfer component 530a, a viscous TIM 540b can be utilized to fill and eliminate gaps at a bond line 541b or interface area between the heat transfer component 530a and the heat transfer component 530b to provide a heat transfer pathway between the components to improve heat transfer performance. The principles disclosed herein can be utilized to maintain the viscous TIM 540b between the heat transfer component 530a and the heat transfer component 530b. Accordingly, the system 500 can include a barrier 550b, as described hereinabove, disposed about the viscous TIM 540b to maintain the viscous TIM within a confined location in proximity to the heat transfer component 530a. The heat transfer component 530b can be coupled to the second substrate 560 via mounts 562, 563, or to the first substrate 510 (as indicated at 512, 513).

One or more other components 570, such as a processor, a memory device, a heat sink, a radio, a slot, and/or a port, can be coupled to the second substrate 560. Such components 570 as desired can be operably coupled to the heat transfer component 530b, as described herein, to cool the components.

Figure 7:
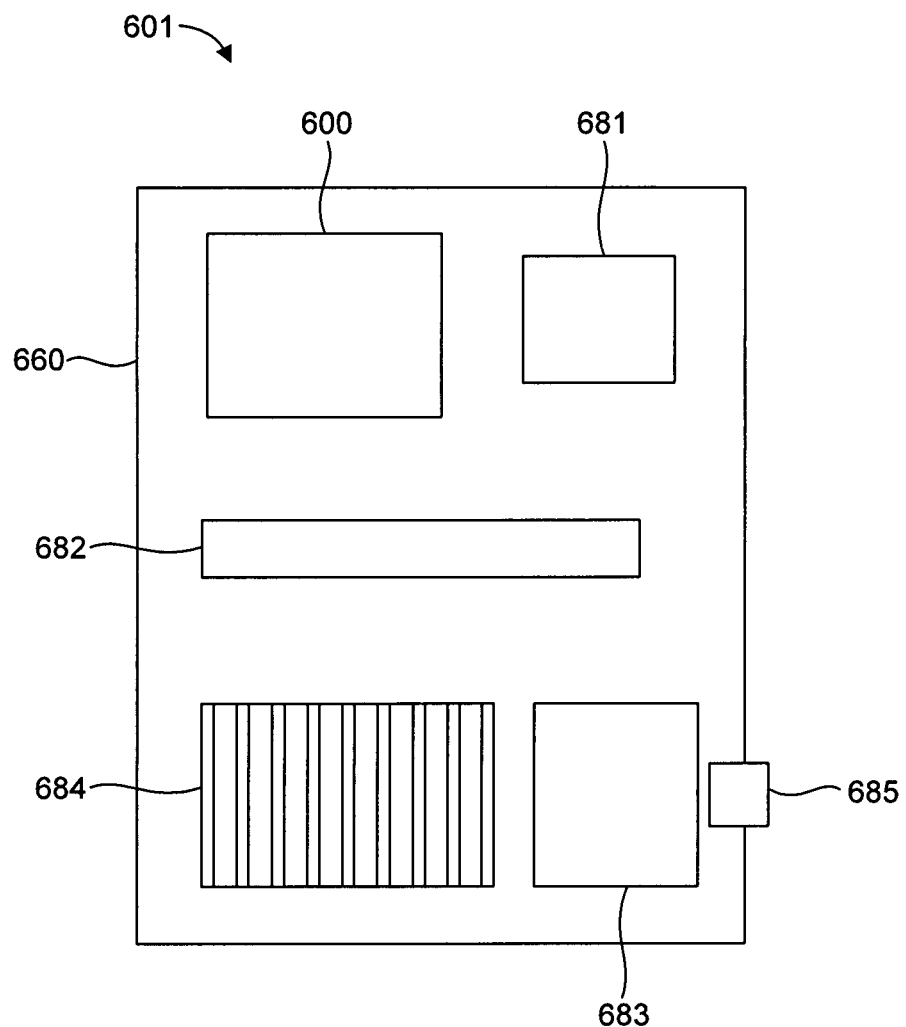
FIG. 7 illustrates a schematic view of an exemplary computing system.

FIG. 7 illustrates a computing system 601 in accordance with an example of the present disclosure. In general, the computing system 601 can include a heat transfer or cooling system 600 as disclosed herein. In one example, the computing system 601 can include the heat transfer system 600 configured as an electronic device package (see, e.g., FIG. 5), and a motherboard 660. In one aspect, the computing system 601 can also include a processor 681, a memory device 682, a radio 683, a heat sink 684, a port 685, a slot, or any other suitable device, which can be operably coupled to the motherboard 660. The computing system 601 can comprise any type of computing system, such as a desktop computer, a laptop computer, a tablet computer, a smartphone, a server, etc.

EXAMPLES

The following examples pertain to further embodiments.

In one example there is provided, an electronic device heat transfer system comprising: a substrate; a heat transfer component; a heat-generating electronic component coupled to the substrate between the substrate and the heat transfer component; a viscous TIM providing a heat transfer pathway between the electronic component and the heat transfer component; and a barrier about at least a portion of a periphery of the viscous TIM to maintain the viscous TIM within a confined location in proximity to the electronic component, with the TIM being uninterrupted by the barrier within the periphery.

In one example of an electronic device heat transfer system, the barrier is continuous about the periphery of the viscous TIM.

In one example of an electronic device heat transfer system, the barrier is a gasket.

In one example of an electronic device heat transfer system, the gasket and the viscous TIM are distinct from one another.

In one example of an electronic device heat transfer system, the gasket is an EMI gasket.

In one example of an electronic device heat transfer system, the barrier comprises a hardened portion of the viscous TIM.

In one example of an electronic device heat transfer system, the viscous TIM includes a curable material and the hardened portion is created by curing the curable material.

In one example of an electronic device heat transfer system, the curable material is an ultraviolet (UV) light curable material.

In one example of an electronic device heat transfer system, the barrier contacts both the substrate and the heat transfer component and extends therebetween.

In one example of an electronic device heat transfer system, the barrier is coupled to the substrate, the heat transfer component, or both the substrate and the heat transfer component.

In one example of an electronic device heat transfer system, the heat transfer component is coupled to the substrate.

In one example of an electronic device heat transfer system, the substrate is coupled to a motherboard.

In one example of an electronic device heat transfer system, the heat transfer component is coupled to the motherboard.

In one example of an electronic device heat transfer system, the heat transfer component comprises a heat spreader.

In one example of an electronic device heat transfer system, the heat transfer component comprises a heat sink.

In one example of an electronic device heat transfer system, the electronic component comprises a processor.

In one example of an electronic device heat transfer system, the electronic device heat transfer system can further comprise a second heat transfer component, a second viscous TIM to facilitate heat transfer between the first heat transfer component and the second heat transfer component, and a second barrier about at least a portion of a second periphery of the second TIM to maintain the second viscous TIM within the second periphery. The second viscous TIM is uninterrupted by the second barrier within the second periphery.

In one example of an electronic device heat transfer system, the second barrier is continuous about the second periphery of the second viscous TIM.

In one example of an electronic device heat transfer system, the second barrier comprises a gasket.

In one example of an electronic device heat transfer system, the gasket and the second viscous TIM are distinct from one another.

In one embodiment, the gasket is an EMI gasket.

In one example of an electronic device heat transfer system, the second barrier comprises a hardened portion of the second viscous TIM.

In one example of an electronic device heat transfer system, the second viscous TIM includes a curable material and the hardened portion is created by curing the curable material.

In one example of an electronic device heat transfer system, the curable material is an ultraviolet (UV) light curable material.

In one example of an electronic device heat transfer system, the second barrier extends between the substrate and the second heat transfer component.

In one example of an electronic device heat transfer system, the second heat transfer component is coupled to the substrate.

In one example of an electronic device heat transfer system, the second heat transfer component is coupled to a motherboard.

In one example of an electronic device heat transfer system, the second heat transfer component comprises a heat spreader.

In one example of an electronic device heat transfer system, the second heat transfer component comprises a heat sink.

In one example there is provided, an electronic device cooling system comprising: a substrate or a heat transfer component, and a barrier configured to engage either the substrate or the heat transfer component, or both at a location associated with a heat transfer pathway, the barrier being formable about at least a portion of a periphery of a viscous TIM in the pathway to maintain the viscous TIM within said periphery and the viscous TIM being uninterrupted by the barrier within the periphery.

In one example of an electronic device cooling system, the barrier is continuous about the periphery of the viscous TIM.

In one example of an electronic device cooling system, the barrier comprises a gasket.

In one example of an electronic device cooling system, the gasket and the viscous TIM are distinct from one another.

In one example of an electronic device cooling system, the gasket is an EMI gasket.

In one example of an electronic device cooling system, the electronic device cooling system comprises both the substrate and the heat transfer component, and the barrier is extendable therebetween.

In one example of an electronic device cooling system, the heat transfer component comprises a heat spreader.

In one example of an electronic device cooling system, the heat transfer component comprises a heat sink.

In one example of an electronic device cooling system, the heat transfer pathway includes a heat-generating electronic component.

In one example of an electronic device cooling system, the heat-generating electronic component comprises a processor.

In one example there is provided, a computing system comprising a motherboard and an electronic device package as disclosed herein, mounted on the motherboard.

In one example of a computing system, the computing system further comprises a processor, a memory device, a heat sink, a radio, a slot, a port, or a combination thereof operably coupled to the motherboard.

In one example of a computing system, the computing system comprises a desktop computer, a laptop computer, a tablet computer, a smartphone, a server, or a combination thereof.

In one example there is provided, a viscous TIM for facilitating heat transfer between two components comprising: a viscous thermal grease and a hardenable polymer, with the polymer forming a hardened structure when exposed to a hardening agent.

In one example of a viscous TIM for facilitating heat transfer, the hardened structure forms a barrier about at least a portion of a periphery of the TIM.

In one example of a viscous TIM for facilitating heat transfer, the barrier is Continuous about the periphery of the TIM.

In one example of a viscous TIM for facilitating heat transfer, the polymer is hardenable by exposure to UV light.

In one example of a viscous TIM for facilitating heat transfer, the polymer is hardenable by exposure to oxygen.

In one example there is provided, a method for minimizing migration of a viscous TIM away from a predetermined location in a heat transfer pathway of an electronic device comprising: disposing the viscous TIM in the predetermined location; and forming a barrier about at least a portion of a periphery of the viscous TIM, with the viscous TIM being uninterrupted by the barrier within the periphery.

In one example of a method for minimizing migration of a viscous TIM, the predetermined location includes a heat-generating electronic component.

In one example of a method for minimizing migration of a viscous TIM, the predetermined location is bounded by a first layer component and a second layer component.

In one example of a method for minimizing migration of a viscous TIM, the first layer component is a substrate and the second layer component is a heat transfer component.

In one example of a method for minimizing migration of a viscous TIM, the substrate is a motherboard.

In one example of a method for minimizing migration of a viscous TIM, the first and second layer components are heat transfer components.

In one example of a method for minimizing migration of a viscous TIM, the barrier contacts both the first and second layer components and extends therebetween.

In one example of a method for minimizing migration of a viscous TIM, forming the barrier comprises disposing a gasket about the viscous TIM.

In one example of a method for minimizing migration of a viscous TIM, the gasket is an EMI gasket.

In one example of a method for minimizing migration of a viscous TIM, forming the barrier comprises hardening a peripheral portion of the viscous TIM.

In one example of a method for minimizing migration of a viscous TIM, hardening a peripheral portion of the viscous TIM comprises exposing the peripheral portion of the TIM to a hardening agent.

In one example of a method for minimizing migration of a viscous TIM, hardening agent is UV light.

In one example of a method for minimizing migration of a viscous TIM, hardening agent is oxygen.

In one example there is provided, a method for maintaining heat transfer efficiency of a heat transfer pathway in an electronic device comprising: disposing a viscous TIM in a heat transfer pathway between a first layer component and a second layer component of the electronic device; and minimizing migration of the viscous TIM out of the heat transfer pathway by locating a barrier about at least a portion of a periphery of the viscous TIM, with the viscous TIM being uninterrupted by the barrier within the periphery.

In one example of a method for maintaining heat transfer efficiency of a heat transfer pathway, the barrier is continuous about the periphery of the viscous TIM.

In one example of a method for maintaining heat transfer efficiency of a heat transfer pathway, the barrier comprises a gasket.

In one example of a method for maintaining heat transfer efficiency of a heat transfer pathway, the gasket is an EMI gasket.

In one example of a method for maintaining heat transfer efficiency of a heat transfer pathway, the barrier comprises a hardened peripheral portion of the TIM.

In one example of a method for maintaining heat transfer efficiency of a heat transfer pathway, the hardened peripheral portion of the TIM is hardened by a hardening agent.

In one example of a method for maintaining heat transfer efficiency of a heat transfer pathway, the hardening agent is UV light.

In one example of a method for maintaining heat transfer efficiency of a heat transfer pathway, the hardening agent is oxygen.

In one example of a method for maintaining heat transfer efficiency of a heat transfer pathway, a heat-generating electronic component initiates movement of heat energy along the heat transfer pathway.

In one example of a method for maintaining heat transfer efficiency of a heat transfer pathway, the electronic component comprises a processor.

In one example of a method for maintaining heat transfer efficiency of a heat transfer pathway, the first layer component is a substrate and the second layer component is a heat transfer component.

In one example of a method for maintaining heat transfer efficiency of a heat transfer pathway, the substrate is a motherboard.

In one example of a method for maintaining heat transfer efficiency of a heat transfer pathway, the first and second layer components are heat transfer components.

In one example there is provided, a method of making an electronic device package can comprising: coupling a heat-generating electronic component to a substrate; associating a heat spreader with the electronic component; disposing a viscous TIM between the electronic component and the heat spreader to facilitate heat transfer between the electronic component and the heat spreader; and forming a barrier about at least a portion of a periphery of the viscous TIM to maintain the viscous TIM within the periphery, with the viscous TIM being uninterrupted by the barrier within the periphery.

In one example of a method of making an electronic device package, the barrier comprises a gasket.

In one example of a method of making an electronic device package, forming the barrier comprises disposing the gasket about the viscous TIM.

In one example of a method of making an electronic device package, the barrier comprises a hardened portion of the viscous TIM.

In one example of a method of making an electronic device package, forming the barrier comprises hardening a peripheral portion of the viscous TIM.

In one example of a method of making an electronic device package, hardening a peripheral portion of the viscous TIM comprises exposing the peripheral portion to UV light.

In one example of a method of making an electronic device package, hardening a peripheral portion of the viscous TIM comprises exposing the peripheral portion to oxygen.

In one example of a method of making an electronic device package, the heat-generating electronic component comprises a processor.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended thereby.

What is claimed is:

1. An electronic device heat transfer system, comprising:
   a substrate;
   a heat transfer component;
   a heat-generating electronic component coupled to the substrate between the substrate and the heat transfer component;
   a viscous thermal interface material (TIM) providing a heat transfer pathway between the electronic component and the heat transfer component, a portion of the viscous TIM being disposed on a lateral side of the heat-generating electronic component; and
   a barrier about at least a portion of a periphery of the viscous TIM to maintain the viscous TIM within a confined location about the heat-generating electronic component, wherein the TIM is uninterrupted by the barrier within the periphery, and wherein the barrier comprises a hardened portion of the viscous TIM.

2. The electronic device heat transfer system of claim 1, wherein the barrier is continuous about the periphery of the viscous TIM.

3. The electronic device heat transfer system of claim 1, wherein the barrier is a gasket.

4. The electronic device heat transfer system of claim 1, wherein the barrier contacts both the substrate and the heat transfer component and extends therebetween.

5. The electronic device heat transfer system of claim 1, wherein the barrier is attached with an adhesive.

6. The electronic device heat transfer system of claim 1, wherein the heat transfer component is coupled to the substrate.

7. The electronic device heat transfer system of claim 1, wherein the heat transfer component comprises a heat spreader.

8. The electronic device heat transfer system of claim 1, wherein the heat transfer component comprises a heat sink.

9. The electronic device heat transfer system of claim 1, wherein the electronic component comprises a processor.

10. The electronic device heat transfer system of claim 1, further comprising:
    a second heat transfer component;
    a second viscous TIM to facilitate heat transfer between the first heat transfer component and the second heat transfer component; and
    a second barrier about at least a portion of a second periphery of the second TIM to maintain the second viscous TIM within the second periphery, wherein the second viscous TIM is uninterrupted by the second barrier within the second periphery.

11. The electronic device heat transfer system of claim 10, wherein the second barrier is continuous about the second periphery of the second viscous TIM.

12. The electronic device heat transfer system of claim 10, wherein the second barrier comprises a gasket.

13. The electronic device heat transfer system of claim 10, wherein the second barrier comprises a hardened portion of the second viscous TIM.

14. The electronic device heat transfer system of claim 10, wherein the second barrier extends between the substrate and the second heat transfer component.

15. The electronic device heat transfer system of claim 10, wherein the second heat transfer component is coupled to the substrate.

16. The electronic device heat transfer system of claim 10, wherein the second heat transfer component comprises a heat spreader.

17. The electronic device heat transfer system of claim 10, wherein the second heat transfer component comprises a heat sink.

18. A method for minimizing migration of a viscous thermal interface material (TIM) away from a predetermined location in a heat transfer pathway of an electronic device, comprising:
   disposing the viscous TIM in the predetermined location, wherein a portion of the viscous TIM is initially configured to be disposed on a top side of a heat-generating electronic component and is movable to a lateral side of the heat-generating electronic component; and
   forming a barrier about at least a portion of a periphery of the viscous TIM wherein the barrier comprises a hardened portion of the viscous TIM.

19. The method of claim 18, wherein the predetermined location is bounded by a first layer component and a second layer component.

20. The method of claim 18, wherein forming the barrier comprises disposing a gasket about the viscous TIM.

21. The method of claim 18, wherein forming the barrier comprises hardening a peripheral portion of the viscous TIM.

* * * * *